United States Patent
Liu et al.

(10) Patent No.: US 10,008,425 B2
(45) Date of Patent: Jun. 26, 2018

(54) MITIGATING ELECTROMIGRATION, IN-RUSH CURRENT EFFECTS, IR-VOLTAGE DROP, AND JITTER THROUGH METAL LINE AND VIA MATRIX INSERTION

(71) Applicant: QUALCOMM Incorporated, San Diego, CA (US)

(72) Inventors: Chun-Chen Liu, San Diego, CA (US); Ju-Yi Lu, San Diego, CA (US); Shengqiong Xie, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days. days.

(21) Appl. No.: 15/340,812

(22) Filed: Nov. 1, 2016

(65) Prior Publication Data

US 2017/0047259 A1 Feb. 16, 2017

Related U.S. Application Data

(62) Division of application No. 14/340,381, filed on Jul. 24, 2014, now Pat. No. 9,496,174.

(51) Int. Cl.
*H01L 21/326* (2006.01)
*H01L 21/479* (2006.01)
(Continued)

(52) U.S. Cl.
CPC .......... *H01L 22/20* (2013.01); *G06F 17/5077* (2013.01); *H01L 21/76816* (2013.01);
(Continued)

(58) Field of Classification Search
CPC ............... H01L 22/20; H01L 21/76877; H01L 21/76816; H01L 23/5226; H01L 21/76895;
(Continued)

(56) References Cited

U.S. PATENT DOCUMENTS 5,639,691 A 6/1997 Klein et al.
6,069,068 A 5/2000 Rathore et al.
(Continued)

FOREIGN PATENT DOCUMENTS

CN 101567359 A 10/2009
JP 2005051152 A 2/2005
JP 2007214397 A 8/2007

OTHER PUBLICATIONS

International Search Report and Written Opinion—PCT/US2015/041371—ISA/EPO—dated Sep. 29, 2015.

*Primary Examiner* — Stephen W Smoot
*Assistant Examiner* — Vicki B Booker
(74) *Attorney, Agent, or Firm* — Loza & Loza, LLP

(57) ABSTRACT

Integrated circuits and methods of manufacturing such circuits are disclosed herein that feature metal line-via matrix insertion after place and route processes are performed and/or completed for the integrated circuit's layout. The metal line-via matrix consists of one or more additional metal lines and one or more additional vias that are inserted into the integrated circuit's layout at a specific point to lower the current and current density through a first conductive path that has been determined to suffer from electromigration, IR-voltage drop, and/or jitter. Specifically, the metal line-via matrix provides one or more auxiliary conductive paths to divert and carry a portion of the current that would otherwise flow through the first conductive path. This mitigates electromigration issues and IR-voltage drop along the first conductive path. It may also help alleviate problems due to jitter along the path.

10 Claims, 11 Drawing Sheets

(51) Int. Cl.
*H01L 21/66* (2006.01)
*G06F 17/50* (2006.01)
*H01L 23/528* (2006.01)
*H01L 27/02* (2006.01)
*H01L 21/768* (2006.01)
*H01L 23/522* (2006.01)

(52) U.S. Cl.
CPC .. *H01L 21/76877* (2013.01); *H01L 21/76895* (2013.01); *H01L 23/528* (2013.01); *H01L 23/5226* (2013.01); *H01L 27/0207* (2013.01); *H01L 23/522* (2013.01); *H01L 2924/0002* (2013.01)

(58) Field of Classification Search
CPC ............... H01L 27/0207; H01L 23/528; H01L 2924/0002; H01L 23/522; G06F 17/5077
See application file for complete search history.

(56) References Cited

U.S. PATENT DOCUMENTS

| | | |
|---|---|---|
| 6,483,045 B1 | 11/2002 | Wang et al. |
| 6,717,268 B2 | 4/2004 | Hau-Riege |
| 7,131,096 B1 | 10/2006 | Balsdon et al. |
| 8,138,603 B2 | 3/2012 | Hsu et al. |
| 2005/0055828 A1 | 3/2005 | Wang et al. |
| 2008/0092100 A1 | 4/2008 | Maziasz et al. |
| 2012/0043663 A1 | 2/2012 | Ko et al. |
| 2014/0131878 A1 | 5/2014 | Gambino et al. |
| 2016/0027691 A1 | 1/2016 | Liu et al. |

MITIGATING ELECTROMIGRATION, IN-RUSH CURRENT EFFECTS, IR-VOLTAGE DROP, AND JITTER THROUGH METAL LINE AND VIA MATRIX INSERTION

CLAIM OF PRIORITY

This application is a divisional of and claims priority to U.S. Non-Provisional application Ser. No. 14/340,381 filed in the U.S. Patent and Trademark Office on Jul. 24, 2014, the entire contents of which are incorporated herein by reference.

FIELD

Various features generally relate to integrated circuits (IC), and more particularly to ICs and methods of manufacturing the same that feature metal line and via matrix insertion to reduce and/or mitigate electromigration, in-rush current effects including IR-voltage drop, and jitter.

BACKGROUND

Electromigration is the transport of material caused by the movement of ions in a conductor due to the momentum transfer between conducting electrons and diffusing metal atoms. A conductor, such as a wire line or interconnect in an IC, is especially susceptible to electromigration when current densities through the conductor are relatively high. Electromigration decreases the reliability of ICs because it may result in voids (i.e., open circuit) and/or shorts along conductive paths within the IC, which may ultimately cause the IC to fail. As IC dimensions continue to decrease in size, electromigration increases in effect and significance.

In-rush current is the maximum, instantaneous input current drawn by an electrical device or circuit when turned ON or otherwise activated in some way. For dynamically saving power, clock-gating is widely used on modern ICs. Consequently however, in-rush current issues result when large currents flow into a circuit when the clock-gating is turned OFF, which may cause considerable IR-voltage drop. The resulting IR-voltage drop may cause operational status changes in transistors, such as turning ON a transistor that is supposed to be OFF. Moreover, in-rush current issues are typical near power switches of the IC, which often makes it a location specific issue. However, chip area at such locations may be very limited due to the IC's design, and thus the amount of chip area occupied by a proposed solution to the in-rush current issue should be as small as possible.

Jitter is the frequency deviation from the static periodicity of a periodic signal. The sources of jitter include power supply noise, data path noise, phase distortion on the circuit (e.g., caused by phase-lock-loops), etc. Jitter can be quite problematic for ICs related to many different applications.

Very commonly, ICs of the prior art employ decoupling capacitors (e.g., "de-caps") to mitigate the above undesirable effects of electromigration. IR-voltage drop caused by in-rush currents, and jitter. Specifically, de-caps are inserted at strategic points in a circuit where one or more of the above problems are anticipated. However, de-caps have distinct drawbacks. First, they consume large chip areas, which in some locations of the IC (e.g., near a power switch) makes their use very impractical or difficult. Second, some de-caps consume significant power since they may include one or more transistors. Third, de-caps have a frequency derived impedance that is selected based on the anticipated operating frequency of the circuit. Problematically, changes to the operating frequency of the circuit (e.g., when the IC enters a lower power state) may negatively affect the performance of the de-cap, which may have to be re-tuned to re-optimize performance.

There is a need for methods and devices that mitigate the problems associated with electromigration, in-rush current based IR-voltage drop, and jitter that consume less power, consume less chip area, and are robust to changes in the operating frequency of the IC.

SUMMARY

One feature provides a method of manufacturing an integrated circuit. The method comprises performing routing of the integrated circuit to generate a plurality of conductive paths across a plurality of metal layers, identifying a first conductive path of the plurality of conductive paths having a current and a current density, the first conductive path including at least a first metal line within a first metal layer, and after performing the steps of routing and identifying, forming an auxiliary conductive path that includes forming a first via, a second metal line, and a second via. The first via electrically couples to the second metal line that is in turn electrically coupled to the second via. The second metal line is positioned within a second metal layer that is different than the first metal layer, and the first and second vias are positioned between the first metal layer and the second metal layer. The first and second vias electrically couple the first metal line to the second metal line such that the auxiliary conductive path reduces the current and the current density of the first conductive path by diverting a portion of the current flowing through the first conductive path. According to one aspect, a path length of the auxiliary conductive path is different than a path length of the first conductive path. According to another aspect, the path length of the auxiliary conductive path is greater than the path length of the first conductive path.

According to one aspect, the method further comprises, after performing the steps of routing and identifying, forming a second auxiliary conductive path that includes a third metal line, a fourth metal line, and a fifth metal line, the third metal line electrically coupled to the fourth metal line that is in turn electrically coupled to the fifth metal line, the third, fourth, and fifth metal lines all positioned within the second metal layer, and the third and fifth metal lines electrically couple the fourth metal line to the second metal line such that the second auxiliary conductive path further reduces the current and the current density of the first conductive path by diverting an additional portion of the current flowing through the first conductive. According to another aspect, a path length for each of the first conductive path, the auxiliary conductive path, and the second auxiliary conductive path are different from one another.

According to one aspect, the method further comprises, after performing the steps of routing and identifying, forming a second auxiliary conductive path that includes forming a third via, a third metal line, and a fourth via, the third via electrically coupled to the third metal line that is in turn electrically coupled to the fourth via, the third metal line positioned within a third metal layer that is different than the first and second metal layers, the third and fourth vias positioned between the second and third metal layers, and the third and fourth vias electrically couple the third metal line to the second metal line such that the second auxiliary conductive path further reduces the current and the current density of the first conductive path by diverting an additional portion of the current flowing through the first conductive.

According to another aspect, forming the auxiliary conductive path further includes a third and fourth metal line in the second metal layer, a first end of the second metal line electrically coupled to the first via through the third metal line, and a second end of the second metal line electrically coupled to the second via through the fourth metal line.

According to one aspect, an end of the second metal line includes a metal extension piece that extends beyond a juncture where the second metal line coupled to a via, the extension piece adapted to collect atoms and/or form a void due to electromigration. According to another aspect, the auxiliary conductive path is formed by inserting the first and second vias and the second metal line into a layout design of the integrated circuit after placing and routing of the integrated circuit has been performed.

Another feature provides an integrated circuit comprising a first conductive path that includes at least a first metal line within a first metal layer, and at least one auxiliary conductive path that includes a first via, a second metal line, and a second via. The first via is electrically coupled to the second metal line that is in turn electrically coupled to the second via, and the second metal line is positioned within a second metal layer that is different than the first metal layer. The first and second vias are positioned between the first metal layer and the second metal layer, and wherein the first and second vias electrically couple the first metal line to the second metal line such that the auxiliary conductive path reduces the current and the current density of the first conductive path by diverting a portion of the current flowing through the first conductive path.

According to one aspect, the integrated circuit further comprises a second auxiliary conductive path that includes a third metal line, a fourth metal line, and a fifth metal line, the third metal line electrically coupled to the fourth metal line that is in turn electrically coupled to the fifth metal line. The third, fourth, and fifth metal lines are all positioned within the second metal layer, and the third and fifth metal lines electrically couple the fourth metal line to the second metal line such that the second auxiliary conductive path further reduces the current and the current density of the first conductive path by diverting an additional portion of the current flowing through the first conductive.

According to one aspect, the integrated circuit further comprises a second auxiliary conductive path that includes a third via, a third metal line, and a fourth via, the third via electrically coupled to the third metal line that is in turn electrically coupled to the fourth via the third metal line positioned within a third metal layer that is different than the first and second metal layers, the third and fourth vias positioned between the second and third metal layers and the third and fourth vias electrically couple the third metal line to the second metal line such that the second auxiliary conductive path further reduces the current and the current density of the first conductive path by diverting an additional portion of the current flowing through the first conductive.

Another feature provides an integrated circuit prepared by the process comprising performing routing of the integrated circuit to generate a plurality of conductive paths across a plurality of metal layers, identifying a first conductive path of the plurality of conductive paths having a current and a current density, the first conductive path including at least a first metal line within a first metal layer, and after performing the steps of routing and identifying, forming an auxiliary conductive path that includes forming a first via, a second metal line, and a second via, the first via electrically coupled to the second metal line that is in turn electrically coupled to the second via, the second metal line positioned within a second metal layer that is different than the first metal layer, the first and second vias positioned between the first metal layer and the second metal layer, and wherein the first and second vias electrically couple the first metal line to the second metal line such that the auxiliary conductive path reduces the current and the current density of the first conductive path by diverting a portion of the current flowing through the first conductive path.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. As used herein, the term "electrically coupled" refers to the direct or indirect coupling between two objects that allows for the flow of electrical current to take place between the two objects. For example, if object A physically touches object B, and object B touches object C, then objects A and C may still be considered electrically coupled to one another even if they do not directly physically touch each other if object B is a conductor that allows for the flow of electrical current to take place from object A to object C and/or from object C to object A.

Overview

Integrated circuits and methods of manufacturing such circuits are disclosed herein that feature metal line-via matrix insertion after place and route processes are performed and/or completed for the integrated circuit's layout. The metal line-via matrix consists of one or more additional metal lines and one or more additional vias that are inserted into the integrated circuit's layout at a specific point to lower the current and current density through a first conductive path that has been determined to suffer from electromigration, IR-voltage drop, and/or jitter. Specifically, the metal line-via matrix provides one or more auxiliary conductive paths to divert and carry a portion of the current that would otherwise flow through the first conductive path. This mitigates electromigration issues and IR-voltage drop along the first conductive path. It may also help alleviate problems due to jitter along the path.

Exemplary ICs Featuring Metal Line and Via Matrix Insertion

Figure 1:
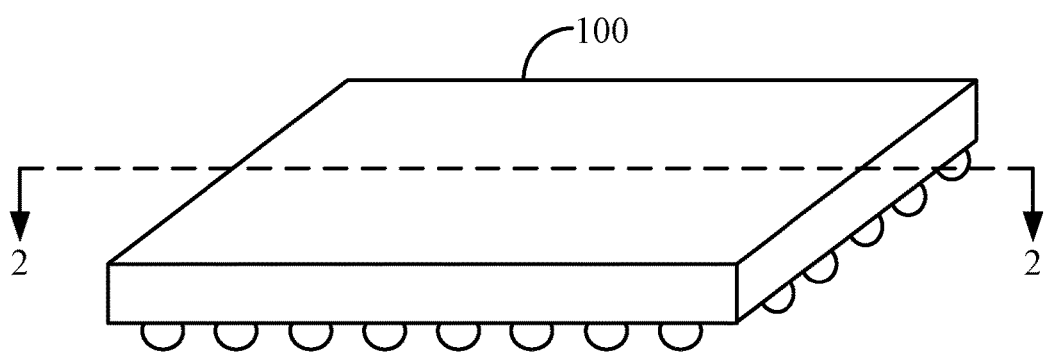
FIG. 1 illustrates a perspective view of an exemplary integrated circuit (IC) featuring metal line and via matrix insertion.

FIG. 1 illustrates a perspective view of an exemplary integrated circuit (IC) 100 featuring metal line and via matrix insertion according to one aspect of the disclosure. The IC 100 may be any type of IC including, but not limited to, a processor, a processing circuit within a processor, a memory circuit, etc. The IC 100 may be found in any electronic device including electronic communication devices such as, but not limited to, mobile phones, computers, tablets, watches, glasses, etc. In the illustrated example, the IC 100 is a "flip-chip" IC. However, the methods and devices described herein equally apply to any other type of IC including a wire-bonded ICs.

Figure 2:
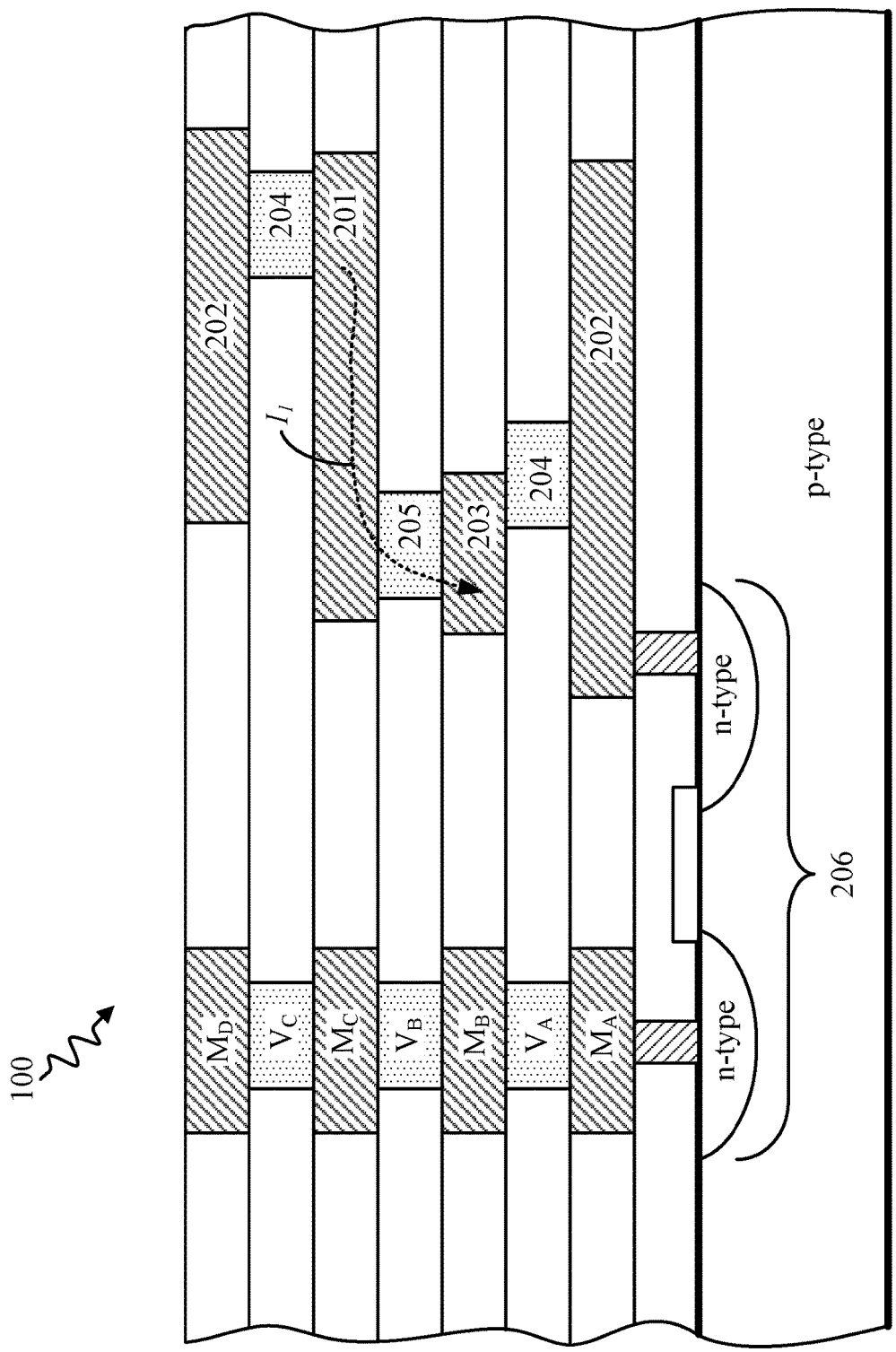
FIG. 2 illustrates a schematic, cross-sectional view of the IC along the line 2-2.

FIG. 2 illustrates a schematic, cross-sectional view of the IC 100 along the line 2-2 (see FIG. 1). The IC 100 includes a plurality of metal layers (e.g., $M_A$, $M_B$, $M_C$, $M_D$, etc.) having metal lines/traces 201, 202, 203 that may be electrically coupled together through conductive vias ($V_A$, $V_B$, $V_C$, etc.). The network of metal lines 201, 202, 203 and vias 204, 205 may, for example, electrically couple a transistor 206 or other circuit element(s) to other portions of the IC 100 such as other devices, power networks, ground networks, etc. by providing a conductive path. One or more of these metal lines 201, 202, 203 and/or vias 204, 205 may be susceptible to electromigration, IR-voltage drop caused by in-rush currents, and/or jitter, and thus the methods and devices for reducing these problematic effects can be applied to such an IC 100. For example, current $I_1$ flowing through the metal lines 201, 203 and via 205 may have a relatively high current density and cause electromigration, IR-voltage drop, and/or jitter problems. As described in greater detail below, the IC 100 includes metal line and via insertion to reduce the current density and current $I_1$ thereby alleviating electromigration, IR-voltage drop, and jitter. In the example shown, four (4) metal layers are depicted. However, in practice the methods and devices described herein apply to an IC having any plurality of metal and via layers.

Figure 3:
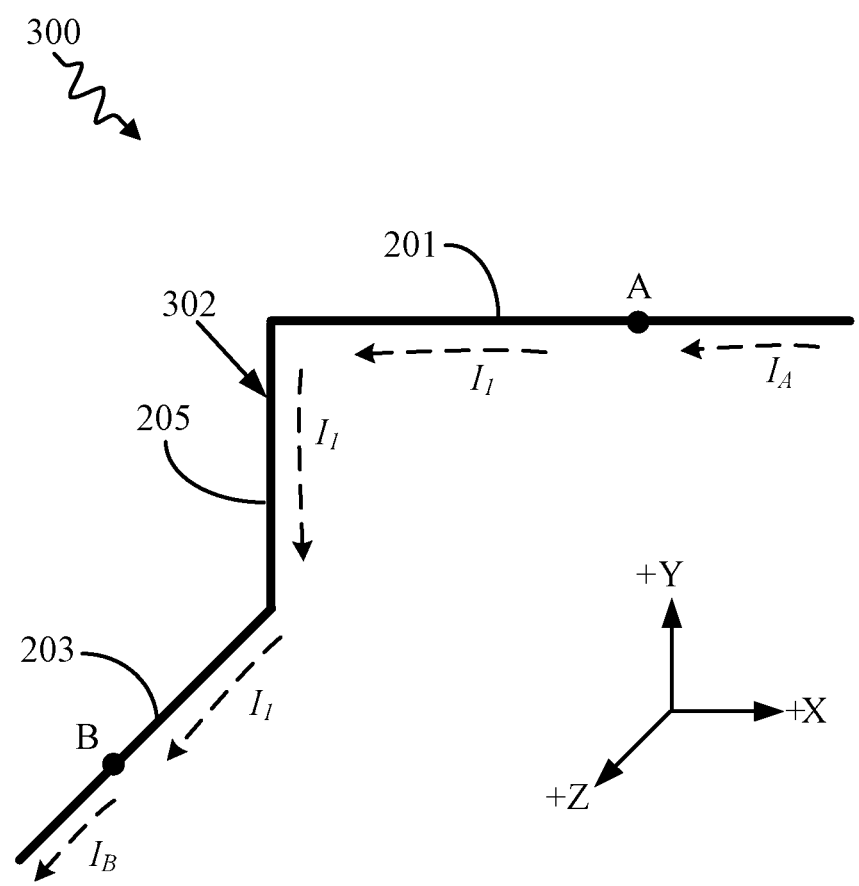
FIG. 3 illustrates a conceptual, perspective view of a first conductive path in the IC.

FIG. 3 illustrates, according to one non-limiting example, a conceptual, perspective view of a conductive path 300 in the IC 100. The conductive path 300 includes a first conductive path 302 that extends from point A to point B and includes the metal lines 201, 203 and via 205. The first conductive path 302 carries the current $I_1$ that flows according to the dashed, directional arrows shown in FIG. 3. Thus, current $I_1$ flows: (1) along the first metal line 201 in a direction starting from the positive X-axis towards the negative X-axis; (2) then down the via 205 (i.e., from the positive Y-axis to the negative Y-axis) and (3) then through the second metal line 203 in a direction from the negative Z-axis to the positive Z-axis. The magnitude of the current $I_A$ entering point A is equal to the magnitude of the current $I_B$ leaving point B. Since the first conductive path 302 shown is the only available path for the current $I_A$ to flow into and the current $I_B$ to flow out of, the magnitude of the current $I_1$ is equal to the magnitude of the currents $I_A$ and $I_B$. Thus, $|I_1|=|I_A|=|I_B|$.

In the illustrated example, the first metal line 201 may be in a higher metal layer (e.g. metal layer $M_C$) than the second metal line 203 (e.g., in metal layer $M_B$), and the via 205 may be in via layer $V_B$. However, this is merely an example. The first metal line 201 may be in any metal layer that is different than the second metal line 203, and one or more vias 205 may electrically couple the two lines 201, 203 together. Similarly, the direction of the currents $I_1$, $I_A$, and $I_B$ may be reversed.

The conductive paths 300, 302 shown in FIG. 3 are generated after placing and routing of the IC 100 (or at least a portion of the IC 100 that includes the conductive paths 300, 302) is performed/completed. After the place and route design stage is performed it may be determined (e.g., through simulation/testing) that the first conductive path 302 is susceptible to electromigration due to high current density and in-rush current induced IR-voltage drop due to the large current flowing through it. The conductive path 302 may also, or in the alternative, be susceptible to jitter issues. As discussed below, inserting one or more additional conductive paths composed of metal lines and vias into the layout design of the IC may reduce the current density and current of the first conductive path 302, and consequently alleviate electromigration, IR-voltage drop, and/or jitter problems.

Figure 4:
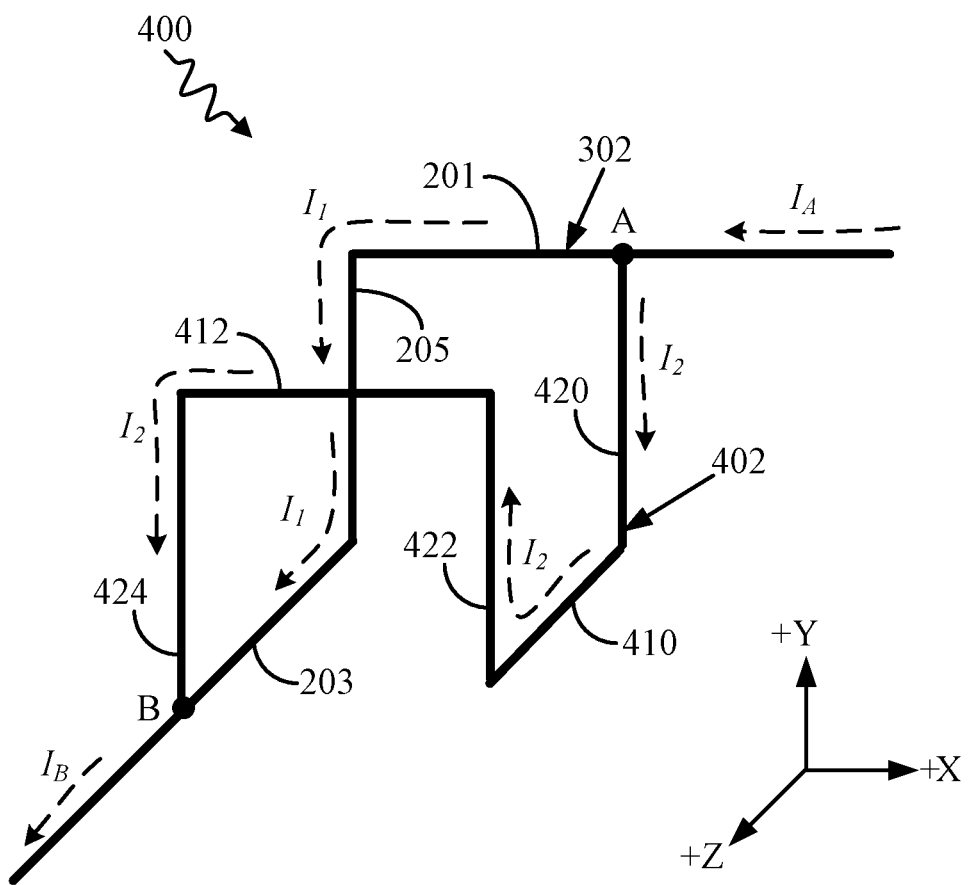
FIG. 4 illustrates a conceptual, perspective view of a second conductive path within the IC featuring metal line-via matrix insertion.

FIG. 4 illustrates a conceptual, perspective view of a conductive path 400 within the IC 100 featuring metal line-via matrix insertion according to one non-limiting example. The conductive path 400 extends from point A to point B and includes the first conductive path 302 (e.g., may be referred to as "main conductive path") discussed above with respect to FIG. 3, and also includes an auxiliary conductive path 402 (e.g., may be referred to as "second conductive path") formed by the insertion of additional metal lines 410, 412 and vias 420, 422, 424. (Inserted metal lines and vias, such as metal lines 410, 412 and vias 420, 422, 424, may be referred to herein as a "metal line-via matrix.") The first inserted metal line 410 may be in a different (e.g., lower) metal layer than the second inserted metal line 412. The first inserted metal line 410 and second inserted metal line 412 may be in the same metal layer as the second metal line 203 and first metal line 201 of the first conductive path 302, respectively. The inserted vias 420, 422, 424 may be in the same via layer as the via 205 of the first conductive path 302. The metal line-via matrix that comprises the auxiliary conductive path 402 is inserted into the layout design of the IC 100 after the place and route stage of the IC 100 (or some portion of the IC 100 thereof that includes the first conductive path 302) has been performed.

Similar to the conductive path 300 described above with respect to FIG. 3, the magnitude of the current $I_A$ in FIG. 4 entering point A is equal to the magnitude of the current $I_B$ leaving point B. However, unlike in FIG. 3, a portion of the current $I_A$ shown in FIG. 4 flows along the first conductive path 302 as current $I_1$ and another portion of the current $I_A$ flows along the auxiliary conductive path 402 as current $I_2$ along the dashed, directional arrows. Thus, in the example shown, the current flows: (1) down through a first inserted via 420 in a direction from the positive Y-axis to the negative Y-axis; (2) through a first inserted metal line 410 in a direction from the negative Z-axis to the positive Z-axis; (3)

up through a second inserted via 422 in a direction from the negative Y-axis to the positive Y-axis; (4) through a second inserted metal line 412 in a direction from the positive X-axis to the negative X-axis; and (5) then back down a third inserted via 424 in a direction from the positive Y-axis to the negative Y-axis where it rejoins the first conductive path's 302 current $I_1$ to form current $I_{13}$ that flows out from point B. Thus, $|I_1+I_2|=|I_A|=|I_B|$.

In effect, the auxiliary conductive path 402 diverts a portion of the current that would otherwise ordinarily flow through the first conductive path 302. By diverting this current through the auxiliary conductive path 402 generating current $I_2$), the current density of the first conductive path 302 (e.g., current $I_1$) is reduced, and consequently any existing electromigration issues along the first conductive path 302 may also be reduced. Similarly, the amount of current (e.g., which may be an in-rush current) flowing through the first conductive path 302 is also reduced resulting in reduced IR-voltage drop. Insertion of the metal line-via matrix may also help reduce jitter along the first conductive path 302.

Moreover, besides reducing the amount of current flowing through the first conductive path 302, the metal line-via matrix provides additional features/properties that reduce in-rush current induced IR-voltage drops. The auxiliary conductive path 402 of the metal line-via matrix has a different length than the first conductive path 302 and consequently it takes a different amount of time for its current $I_2$ to flow from point A to point B than the current $I_1$. In the non-limiting example shown in FIG. 4, the second conductive path 402 is longer than the first conductive path 302 and thus it takes a longer period of time for its current $I_2$ to flow from point A to point B than the current $I_1$. Since the latencies of the auxiliary conductive path 402 and first conductive path 302 are different, in-rush current flowing through the general conductive path 400 (which includes paths 302, 402) is distributed across a longer time interval. This significantly reduces the impact (e.g., reduces IR-voltage drop) of a sudden influx of current. The optimal length of the auxiliary conductive path 402 (or optimal lengths of each auxiliary path in the case of multiple auxiliary paths (see e.g., FIGS. 8 and 10)) may be decided by the resistor-capacitor delay (i.e., RC delay) associated with the conductive path 400 and the clock frequency of the circuit (e.g., clock frequency of IC 100) having the conductive path 400.

Figure 5:
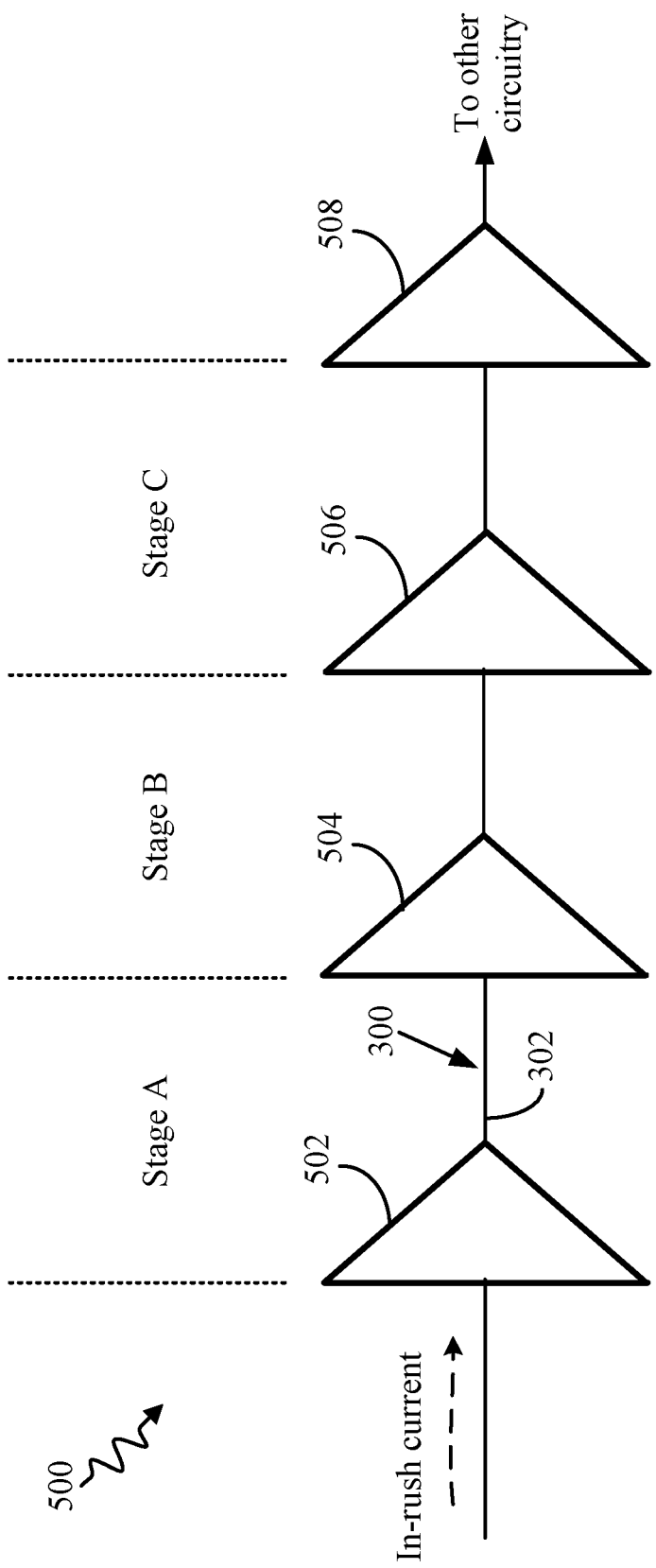
FIG. 5 illustrates a multi-stage buffer path.
Figure 6:
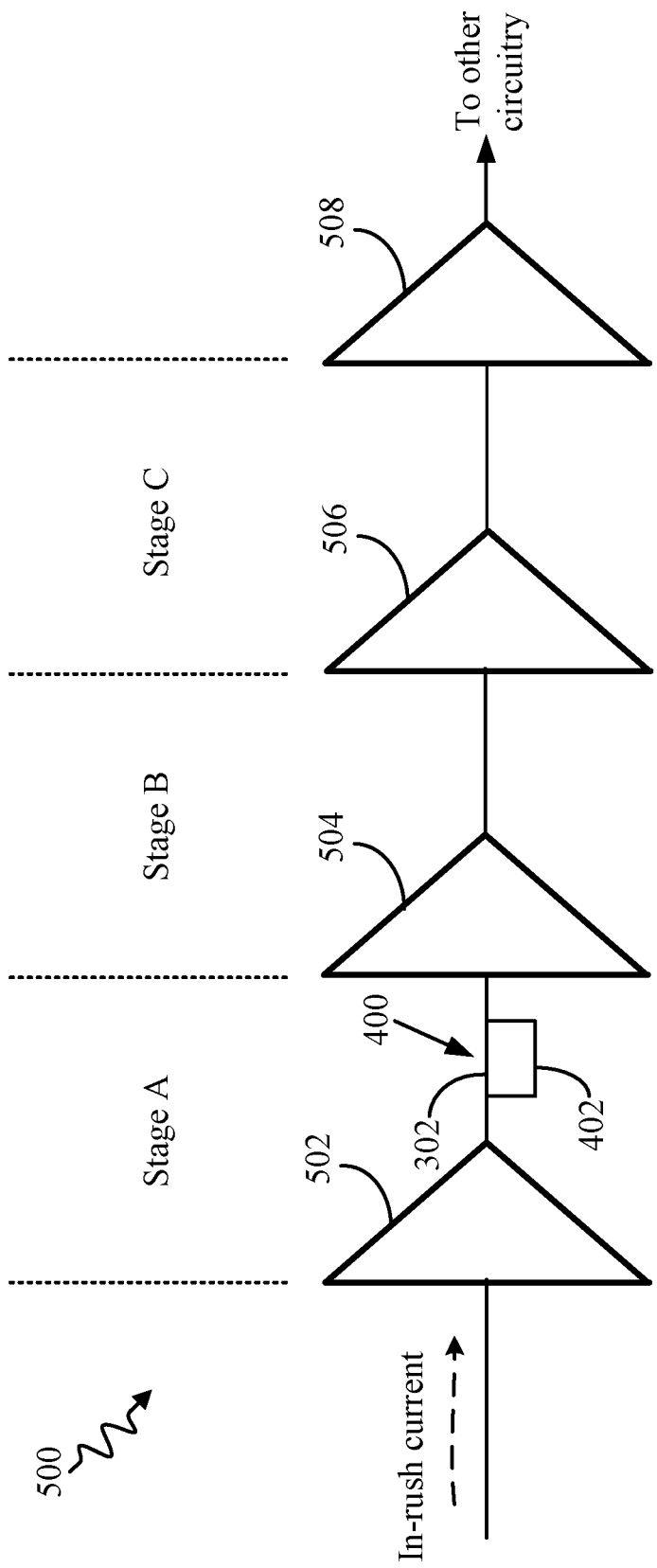
FIG. 6 illustrates the multi-stage buffer path after metal line-via matrix insertion.
Figure 7:
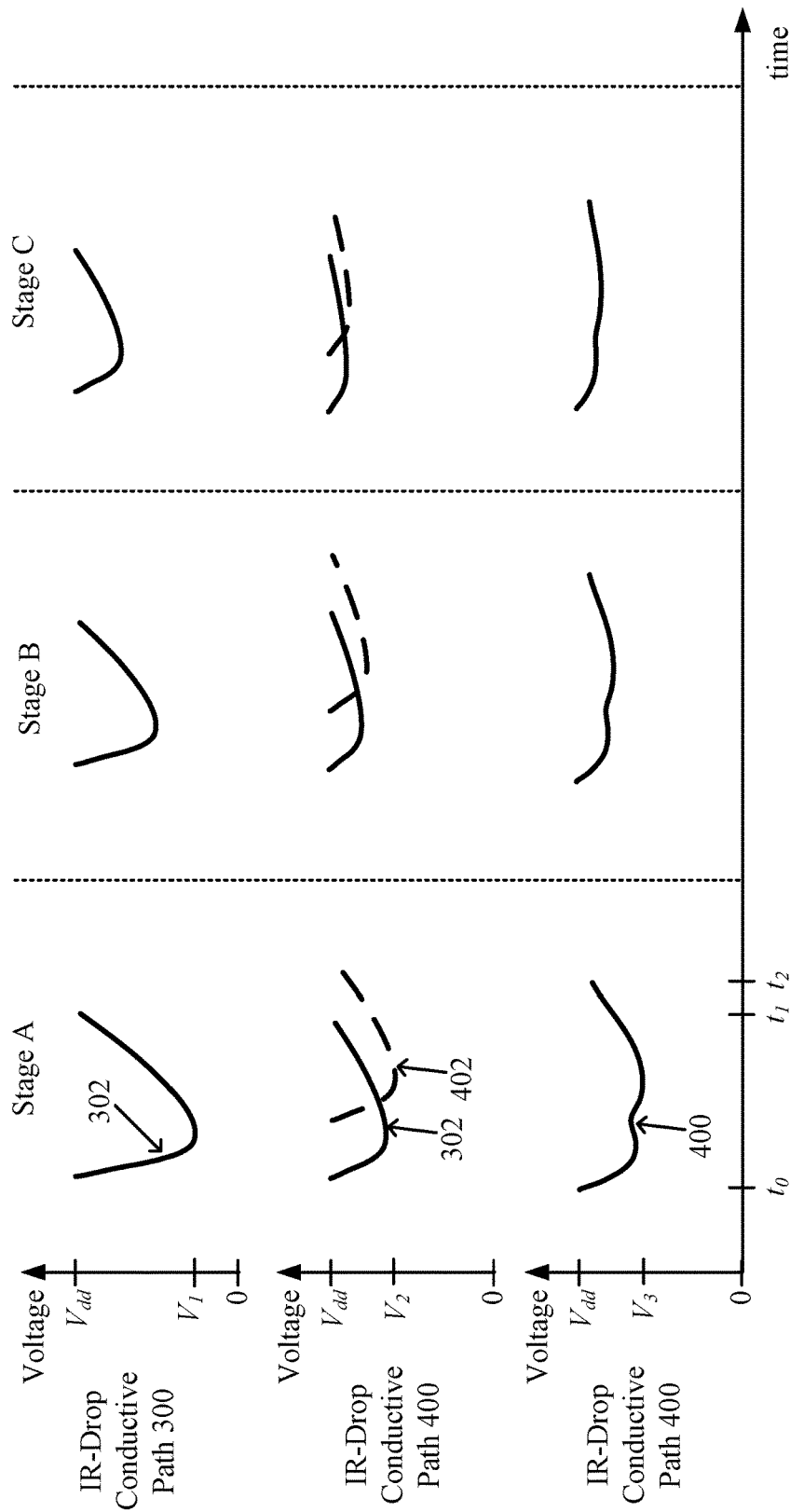
FIG. 7 illustrates the relative IR-voltage drop versus time for stages A, B, and C of the buffer path shown in FIGS. 5 and 6.

FIGS. 5-7 together illustrate how the differing latencies (i.e., signal path delays) of the auxiliary conductive path 402 and the first conductive path 302 help distribute the in-rush current across a longer time interval to reduce the maximum in-rush current induced IR-voltage drop.

FIG. 5 illustrates a multi-stage buffer path 500 according to one aspect of the disclosure. The buffer path 500 includes a first buffer 502, a second 504, a third buffer 506, and a fourth buffer 508. Additional buffers (not shown) may follow the fourth buffer 508. The portion of the buffer path 500 between the first buffer 502 and the second buffer 504 may be considered the Stage A, the portion between the second buffer 504 and the third buffer 506 stage B, and the portion between the third buffer 506 and the fourth buffer 508 stage C. An in-rush current, designated by the dashed arrow in FIG. 5, flows through the buffers path 500. In FIG. 5, the conductive path coupling the first buffer 502 to the second buffer 504 is the conductive path 300 of FIG. 3, which includes the first conductive path 302.

FIG. 6 illustrates the multi-stage buffer path 500 after metal line-via matrix insertion where the conductive path coupling the first buffer 502 to the second buffer 504 is now the conductive path 400 of FIG. 4, which not only includes the first conductive path 302, but also includes the auxiliary conductive path 402. As discussed above, the auxiliary conductive path 402 has a different (e.g., longer) path delay than the first conductive path 302.

FIG. 7 illustrates the relative IR-voltage drop versus time for stages A, B, and C of the buffer path 500 shown in FIGS. 5 and 6 according to the specific conductive path placed between the first and second buffers 502, 504 (e.g., either conductive path 300 of FIG. 3 or the conductive path 400 of FIG. 4). The top third of FIG. 7 shows the in-rush current induced IR-voltage drop of the buffer path 500 when the conductive path 300 of FIG. 3, which includes only the first conductive path 302, electrically couples the first and second buffers 502, 504 to each other. The observed maximum IR-voltage drop at the first conductive path 302 causes the voltage at stage A to drop to voltage $V_1$, which is relatively low. This may cause circuit malfunction if, for example, the low voltage level causes some transistors to turn ON when they should be OFF or turn OFF when they should be on, among other issues.

The middle third of FIG. 7 shows the in-rush current induced IR-voltage drop of the buffer path 500 when the conductive path 400 of FIG. 4, which includes both the first conductive path 302 and the auxiliary conductive path 402, electrically couples the first and second buffers 502, 504 to each other. The observed maximum IR-voltage drop at the first conductive path 302 and the auxiliary conductive path 402 causes the voltage level at stage A of each of these paths 302, 402 to drop to about voltage $V_2$ (where $V_2$ is greater than $V_1$) and to be time shifted with respect to each other because of their different path delays. Thus, the middle third of FIG. 7 shows the individual IR-voltage drop contribution of each conductive path 302, 402.

The bottom third of FIG. 7 shows the in-rush current induced IR-voltage drop of the buffer path 500 when again the conductive path 400 of FIG. 4 electrically couples the first and second buffers 502, 504 to each other. The curve shown here represents the composite maximum IR-voltage drop at stage A, which causes the voltage level of the conductive path 400 to drop to voltage $V_3$. Since $V_3$ is greater than $V_1$, inserting the metal line-via matrix reduces the maximum in-rush induced IR voltage drop of the first conductive path 302 by an amount $V_3-V_1$. The longer signal path delay associated with the auxiliary conductive path 402 causes the overall in-rush current to flow through the conductive path 400 over a greater period of time causing the IR-voltage drop to lengthen in time from $t_0$ to $t_2$ instead of from $t_0$ to $t_1$. The later stages (e.g., stages B and C) of the buffer path 500 exhibit very similarly shaped curves as stage A except with less pronounced (i.e., less magnitude) in-rush current induced IR-voltage drop due to the effect of the buffers 504, 506.

As mentioned above, the example shown in FIG. 4 of the auxiliary conductive path 402 is merely exemplary. Generally, a metal line-via matrix comprising one or more auxiliary conductive paths of any size and shape may be inserted after place and route of the IC 500 is performed and problematic conductive paths are identified that are prone to electromigration, IR-voltage drop, and/or jitter. The metal line-via matrix inserted may generally comprise a first conductive path that includes at least a first metal line within a first metal layer, and at least one auxiliary conductive path that includes: a second metal line within a second metal layer; a first via between the first metal layer and the second metal layer; and a second via between the first metal layer and the second metal layer. The first and second vias electrically couple the first metal line to the second metal line such that the auxiliary conductive path reduces a current and a current density of the first conductive path by sharing/diverting a portion of a current flowing through the first conductive path. Below are some additional non-limiting examples of metal line-via matrices according to different aspects that provide auxiliary conductive paths to reduce electromigration, IR-voltage drop, and/or jitter of a first conductive path.

Figure 8:
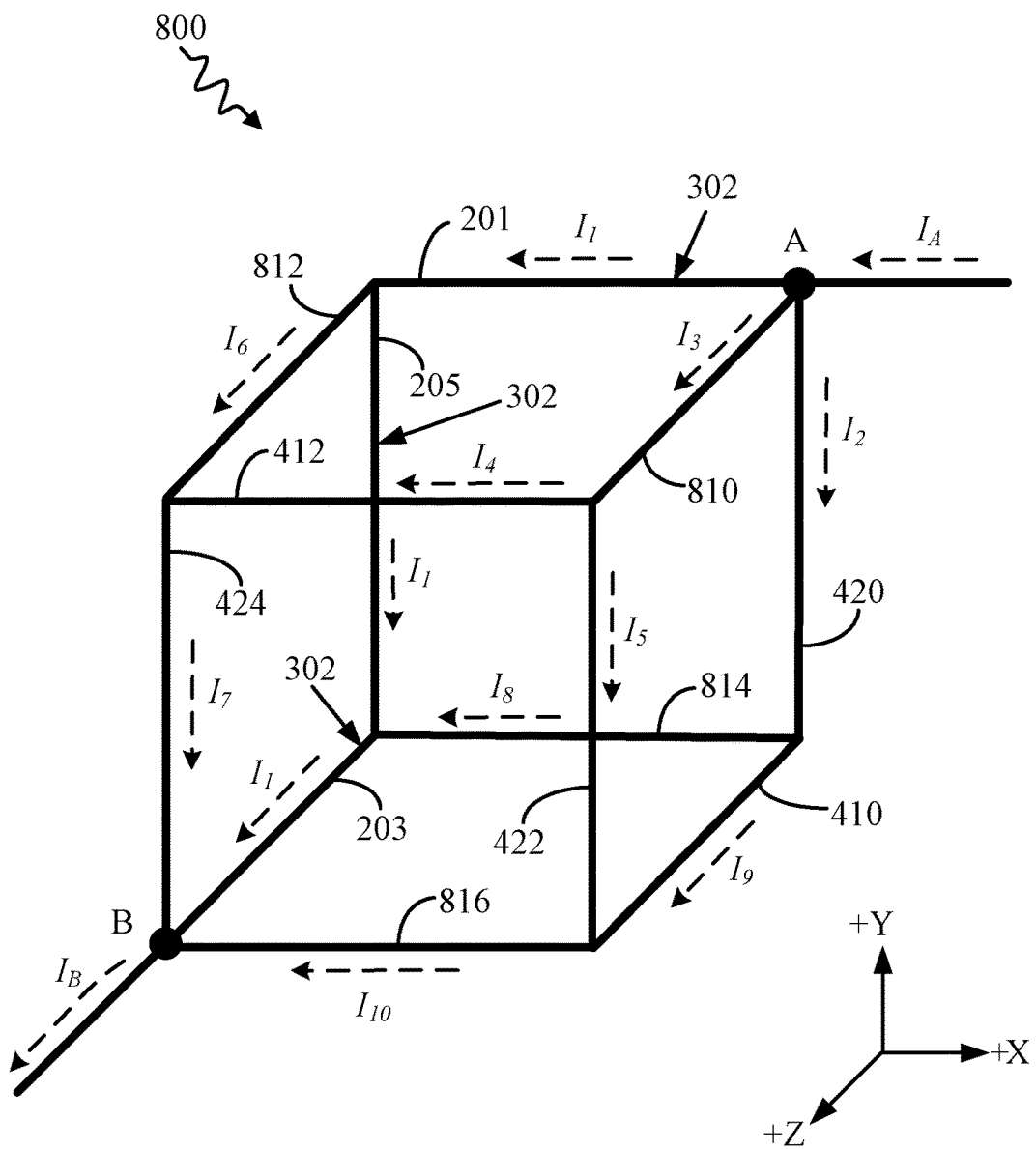
FIG. 8 illustrates a conceptual, perspective view of a third conductive path within the IC featuring metal line-via matrix insertion.

FIG. 8 illustrates a conceptual, perspective view of a conductive path 800 within the IC 100 featuring metal line-via matrix insertion according to another non-limiting example. Similar to the conductive path 400 shown in FIG. 4, the conductive path 800 of FIG. 8 extends from point A to point B and includes the first conductive path 302. The conductive path 800 also includes additional auxiliary current paths formed by the insertion of a metal line-via matrix that includes metal lines 410, 412, 810, 812, 814, 816 and vias 420, 422, 424. Some inserted metal lines 410, 814, 816 may be in a different (e.g., lower) metal layer than other inserted metal lines 412, 810, 812. Some inserted metal lines 410, 814, 816 may be in the same metal layer as the second metal line 203 of the first conductive path 302, and other inserted metal lines 412, 810, 812 may be in the same metal layer as the first metal line 201 of the first conductive path 302. The inserted vias 420, 422, 424 may be in the same via layer as the via 205 of the first conductive path 302. The metal line-via matrix shown in FIG. 8 is inserted after the place and route stage of the IC 100 (or some portion of the IC 100 thereof that includes the first conductive path 302) has been performed.

Similar to the conductive path 300 described above with respect to FIG. 3, the magnitude of the current $I_A$ in FIG. 8 entering point A is equal to the magnitude of the current $I_B$ leaving point B. However, unlike in FIG. 3, only a portion of the current $I_A$ shown in FIG. 8 flows along the first conductive path 302 as current $I_1$. Other significant portions of the current $I_A$ flow along additional auxiliary conductive paths of the metal line-via matrix represented by the currents $I_2$, $I_3$, $I_4$, $I_5$, $I_6$, $I_7$, $I_8$, $I_9$, and $I_{10}$. The auxiliary conductive path currents $I_2$, $I_3$, $I_4$, $I_5$, $I_6$, $I_7$, $I_8$, $I_9$, and $I_{10}$ generally flow in a direction from point A to point B as shown with the dashed, directional arrows.

In effect, the inserted metal line-via matrix diverts a portion of the current that would otherwise ordinarily flow through the first conductive path 302. By diverting this current through the metal line-via matrix (e.g., currents $I_2$, $I_3$, $I_4$, $I_5$, $I_6$, $I_7$, $I_8$, $I_9$, and $I_{10}$), the current density and current of the first conductive path 302 is reduced, and consequently any existing electromigration, in-rush current induced IR-voltage drop, and/or jitter issues along the first conductive path 302 may also be reduced.

Figure 9:
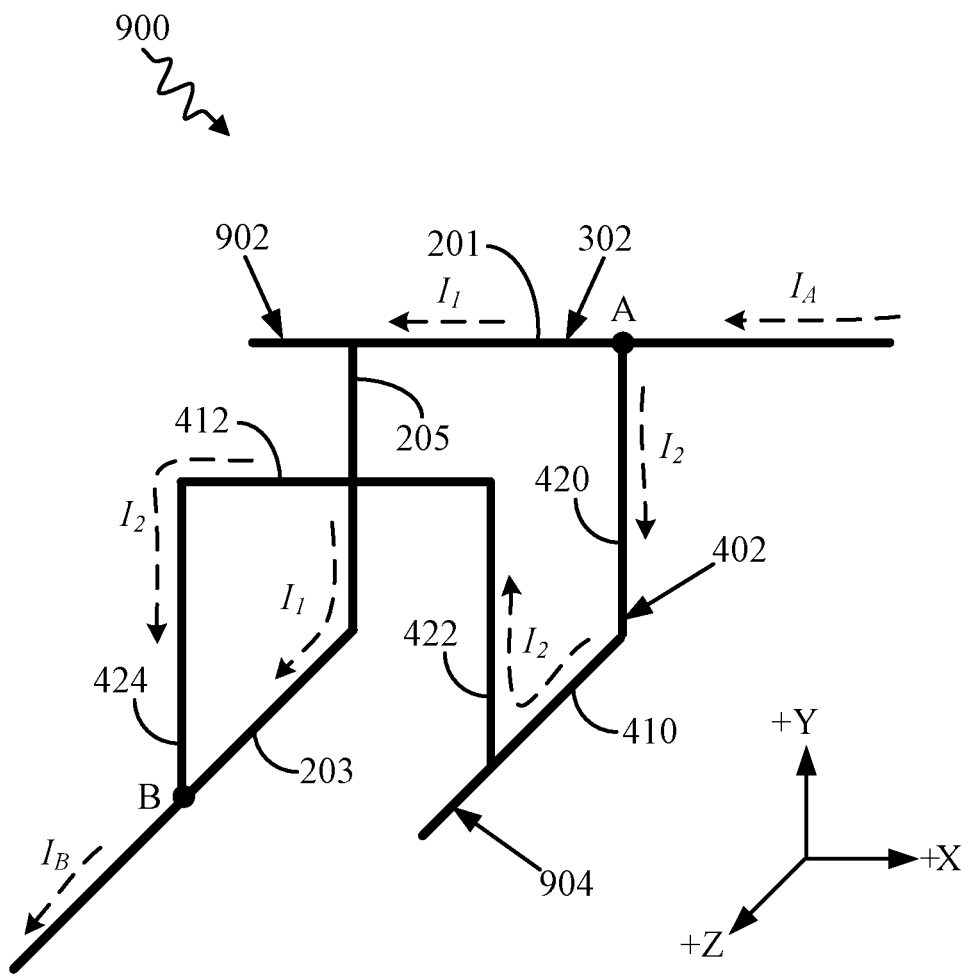
FIG. 9 illustrates a conceptual, perspective view of a fourth conductive path within the IC featuring metal line-via matrix insertion.

FIG. 9 illustrates a conceptual, perspective view of a conductive path 900 within the IC 100 featuring metal line-via matrix insertion according to another non-limiting example. The conductive path 900 shown in FIG. 9 is very similar to the conductive path 400 shown in FIG. 4, except that the first metal line 201 of the first conductive path 302 and the first inserted metal line 410 of the metal line-via matrix include metal extension pieces 902, 904. That is, the first metal line 201 is extended to form the first extension piece 902, and the second inserted metal line 410 is formed to be longer so that it includes the second extension piece 904. The extension pieces 902, 904 extend beyond the juncture where the metal lines 201, 410 couple to the vias 205, 422. The extension pieces 902, 904 act as atom and/or hole (i.e., void) collection pools that buffer the effects of atom and/or hole build up from electromigration. The extension pieces 902, 904 are carefully formed so that they do not extend out too close to other conductive paths of the IC 100 where atom build up from electromigration may cause a short. Similarly, since the ends 906, 908 of the extension pieces 902, 904 do not electrically couple to anything (i.e., they lead nowhere), if an open circuit along the extension pieces 902, 904 forms due to electromigration induced voids, the extension pieces 902, 904 will not cause failure of the conductive path 900. The extension pieces 902, 904 formed at the metal lines 201, 410 shown in FIG. 9 are merely examples. Extension pieces may be formed along any metal line and/or via of a conductive path (e.g., first conductive path and/or auxiliary conductive path) of the IC 100.

Figure 10:
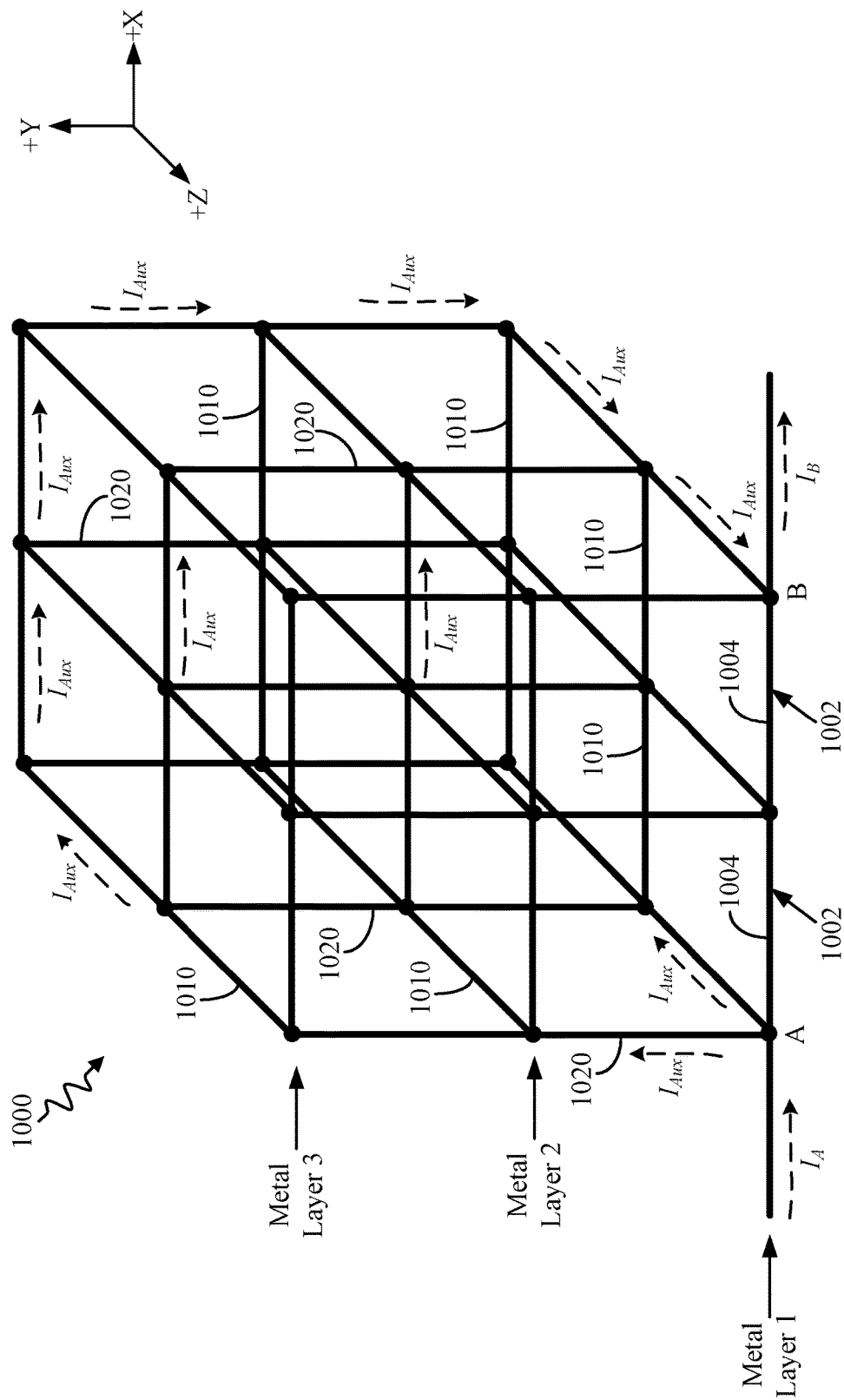
FIG. 10 illustrates a conceptual, perspective view of a fifth conductive path within the IC featuring a metal line-via matrix insertion.

The metal line-via matrix inserted can be of any size and shape (assuming no design rule check (DRC) violations). As such, FIG. 10 illustrates a conceptual, perspective view of a conductive path 1000 within the IC 100 featuring a metal line-via matrix insertion according to another non-limiting example. A first conductive path 1002 that only included a first metal line 1004 is the original conductive path that was prone to electromigration, in-rush current induced IR-voltage drop, and/or jitter. Consequently, the remaining metal lines 1010 and vias 1020 shown (not all are labeled in FIG. 10 for clarity) are inserted after place and route of the IC 100 to create auxiliary conductive paths (labeled $I_{Aux}$; not all are labeled for clarity) to reduce the current density and current through the first conductive path 1002.

Whereas the metal line-via matrix of FIG. 8 may be considered a "2×2" matrix, the one illustrated in FIG. 10 may be considered a "3×3" matrix since it includes inserted metal lines in three different metal layers (e.g., $M_A$, $M_B$, $M_C$, etc.), and vias there between. Other non-limiting metal line-via matrix sizes include 4×4, 2×4, 4×2, 2×3, 3×2, 1×2, 2×1, etc.

Figure 11:
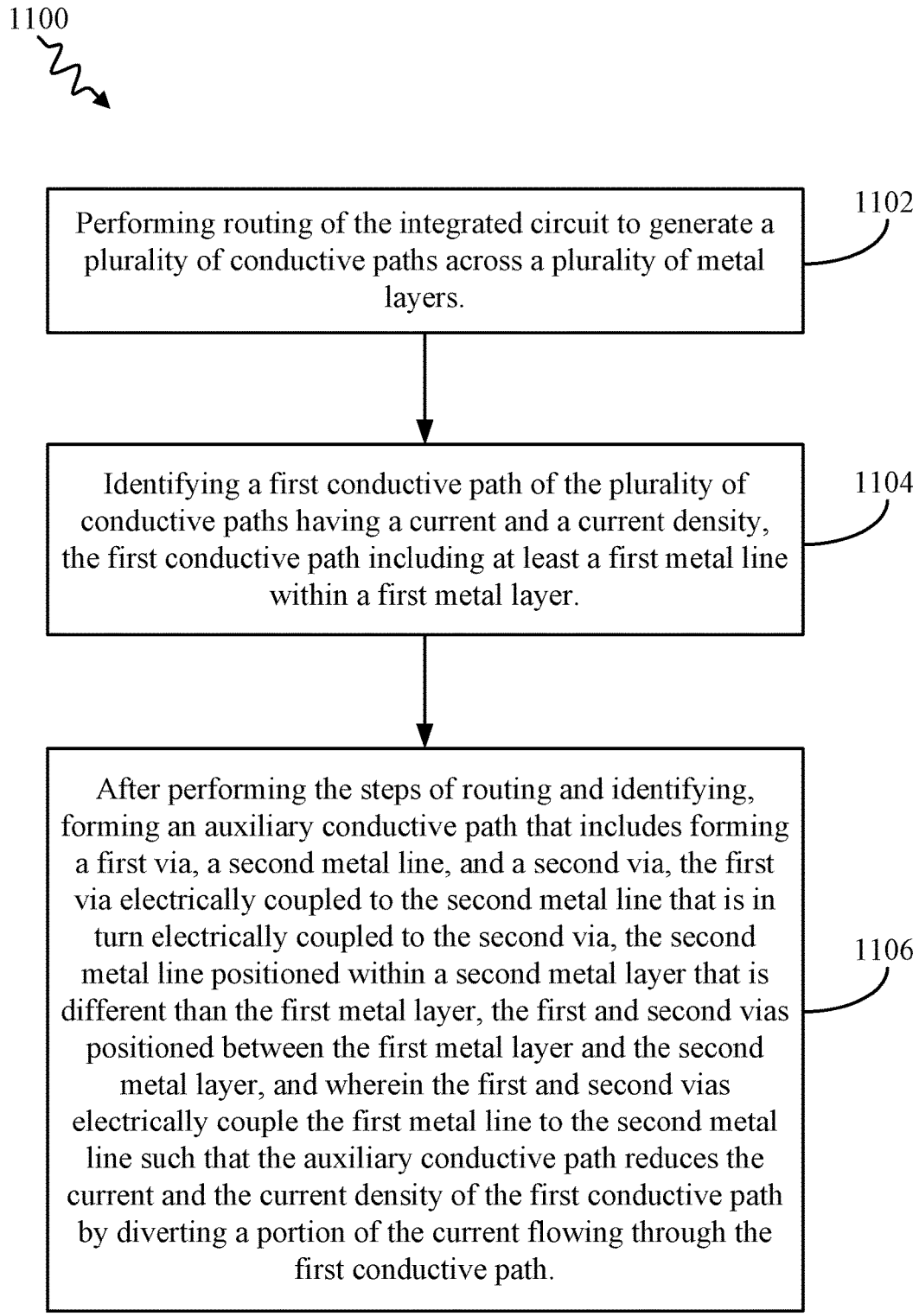
FIG. 11 illustrates a flowchart for a method manufacturing an integrated circuit.

FIG. 11 illustrates a flowchart 1100 for a method manufacturing an integrated circuit according to one aspect of the disclosure. First, routing of the integrated circuit is performed to generate a plurality of conductive paths across a plurality of metal layers 1102. Next, a first conductive path of the plurality of conductive paths is identified having a current and a current density, where the first conductive path includes at least a first metal line within a first metal layer 1104. Then, after performing the steps of routing and identifying, an auxiliary conductive path is formed that includes a first via electrically coupled to a second metal line that is electrically coupled to a second via. The second metal line is positioned within a second metal layer that is different than the first metal layer. The first and second vias are positioned between the first metal layer and the second metal layer. Moreover, the first and second vias electrically couple the first metal line to the second metal line such that the auxiliary conductive path reduces the current and the current density of the first conductive path by diverting a portion of the current flowing through the first conductive path 1106.

Compared to de-coupling capacitors, utilizing metal line-via matrix insertion to combat electromigration, IR-voltage drop, and jitter as described above consumes significantly less power. Moreover, metal line-via matrices take up very little space compared to traditional de-caps.

One or more of the components, steps, features, and/or functions illustrated in FIGS. 1, 2, 3, 4, 5, 6, 7, 8, 9, 10, and 11 may be rearranged and/or combined into a single component, step, feature or function or embodied in several components, steps, or functions. Additional elements, components, steps, and/or functions may also be added without departing from the invention. The algorithms described herein may also be efficiently implemented in software and/or embedded in hardware.

Also, it is noted that the aspects of the present disclosure may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a function, a procedure, a subroutine, a subprogram, etc. When a process corresponds to a function, its termination corresponds to a return of the function to the calling function or the main function.

Moreover, a storage medium may represent one or more devices for storing data, including read-only memory (ROM), random access memory (RAM), magnetic disk storage mediums, optical storage mediums, flash memory devices and/or other machine-readable mediums and, processor-readable mediums, and/or computer-readable mediums for storing information. The terms "machine-readable medium", "computer-readable medium", and/or "processor-readable medium" may include, but are not limited to non-transitory mediums such as portable or fixed storage devices, optical storage devices, and various other mediums capable of storing or containing instruction(s) and/or data. Thus, the various methods described herein may be fully or partially implemented by instructions and/or data that may be stored in a "machine-readable medium", "computer-readable medium", and/or "processor-readable medium" and executed by one or more processors, machines and/or devices.

Furthermore, aspects of the disclosure may be implemented by hardware, software, firmware, middleware, microcode, or any combination thereof. When implemented in software, firmware, middleware or microcode, the program code or code segments to perform the necessary tasks may be stored in a machine-readable medium such as a storage medium or other storage(s). A processor may perform the necessary tasks. A code segment may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

The various illustrative logical blocks, modules, circuits, elements, and/or components described in connection with the examples disclosed herein may be implemented or performed with a general purpose processor, a digital signal processor (DSP), an application specific integrated circuit (ASIC), a field programmable gate array (FPGA) or other programmable logic component, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing components, e.g., a combination of a DSP and a microprocessor, a number of microprocessors, one or more microprocessors in conjunction with a DSP core, or any other such configuration.

The methods or algorithms described in connection with the examples disclosed herein may be embodied directly in hardware, in a software module executable by a processor, or in a combination of both, in the form of processing unit, programming instructions, or other directions, and may be contained in a single device or distributed across multiple devices. A software module may reside in RAM memory, flash memory, ROM memory, EPROM memory, EEPROM memory, registers, hard disk, a removable disk, a CD-ROM, or any other form of storage medium known in the art. A storage medium may be coupled to the processor such that the processor can read information from, and write information to, the storage medium. In the alternative, the storage medium may be integral to the processor.

Those of skill in the art would further appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system.

The various features of the invention described herein can be implemented in different systems without departing from the invention. It should be noted that the foregoing aspects of the disclosure are merely examples and are not to be construed as limiting the invention. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A method of manufacturing an integrated circuit, the method comprising:
performing routing of the integrated circuit to generate a plurality of conductive paths across a plurality of metal layers;
identifying a first conductive path of the plurality of conductive paths having a current and a current density, the first conductive path extending from a first point of the integrated circuit to a second point of the integrated circuit and including at least a first metal line within a first metal layer; and
after performing the steps of routing and identifying, forming an auxiliary conductive path extending from the first point to the second point that includes forming a first via, a second metal line, and a second via, the first via electrically coupled to the second metal line that is in turn electrically coupled to the second via, the second metal line positioned within a second metal layer that is different than the first metal layer, the first and second vias positioned between the first metal layer and the second metal layer, and wherein the first and second vias electrically couple the first metal line to the second metal line such that the auxiliary conductive path reduces the current and the current density of the first conductive path by diverting a portion of the current flowing through the first conductive path.

2. The method of claim 1, wherein a path length of the auxiliary conductive path is different than a path length of the first conductive path.

3. The method of claim 2, wherein the path length of the auxiliary conductive path is greater than the path length of the first conductive path.

4. The method of claim 1, further comprising:
after performing the steps of routing and identifying, forming a second auxiliary conductive path that includes forming a third metal line, a fourth metal line, and a fifth metal line, the third metal line electrically coupled to the fourth metal line that is in turn electrically coupled to the fifth metal line, the third, fourth, and fifth metal lines all positioned within the second metal layer, and the third and fifth metal lines electrically couple the fourth metal line to the second metal line such that the second auxiliary conductive path further reduces the current and the current density of the first conductive path by diverting an additional portion of the current flowing through the first conductive path.

5. The method of claim 4, wherein a path length for each of the first conductive path, the auxiliary conductive path, and the second auxiliary conductive path are different from one another.

6. The method of claim 1, further comprising:
after performing the steps of routing and identifying, forming a second auxiliary conductive path that includes forming a third via, a third metal line, and a fourth via, the third via electrically coupled to the third metal line that is in turn electrically coupled to the fourth via, the third metal line positioned within a third metal layer that is different than the first and second metal layers, the third and fourth vias positioned between the second and third metal layers, and the third and fourth vias electrically couple the third metal line to the second metal line such that the second auxiliary conductive path further reduces the current and the current density of the first conductive path by diverting an additional portion of the current flowing through the first conductive path.

7. The method of claim 6, wherein a path length for each of the first conductive path, the auxiliary conductive path, and the second auxiliary conductive path are different from one another.

8. The method of claim 1, wherein forming the auxiliary conductive path further includes a third and fourth metal line in the second metal layer, a first end of the second metal line electrically coupled to the first via through the third metal line, and a second end of the second metal line electrically coupled to the second via through the fourth metal line.

9. The method of claim 1, wherein an end of the second metal line includes a metal extension piece that extends beyond a juncture where the second metal line is coupled to a via, the extension piece adapted to collect atoms and/or form a void due to electromigration.

10. The method of claim 1, wherein the auxiliary conductive path is formed by inserting the first and second vias and the second metal line into a layout design of the integrated circuit after placing and routing of the integrated circuit has been performed.

* * * * *